(12) United States Patent
Fukushima et al.

(10) Patent No.: US 9,136,046 B2
(45) Date of Patent: Sep. 15, 2015

(54) SUPERCONDUCTING WIRE ROD AND METHOD FOR MANUFACTURING SUPERCONDUCTING WIRE ROD

(75) Inventors: Hiroyuki Fukushima, Tokyo (JP); Yuko Hayase, Tokyo (JP); Yoshikazu Okuno, Tokyo (JP); Eiji Kojima, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 6 days.

(21) Appl. No.: 13/985,284

(22) PCT Filed: Feb. 14, 2012

(86) PCT No.: PCT/JP2012/053435
§ 371 (c)(1),
(2), (4) Date: Aug. 13, 2013

(87) PCT Pub. No.: WO2012/111678
PCT Pub. Date: Aug. 23, 2012

(65) Prior Publication Data
US 2013/0316908 A1    Nov. 28, 2013

(30) Foreign Application Priority Data
Feb. 15, 2011    (JP) ................................ 2011-029845

(51) Int. Cl.
*H01L 39/12*    (2006.01)
*H01B 12/06*    (2006.01)
(Continued)

(52) U.S. Cl.
CPC ................ *H01B 12/06* (2013.01); *H01B 13/30* (2013.01); *H01L 39/2461* (2013.01)

(58) Field of Classification Search
CPC ..... H01L 39/126; H01L 39/143; H01L 39/24; H01L 39/2454; H01L 39/2458; H01L 39/2461; H01L 39/248; H01B 12/06; C30B 29/22; B23B 18/00
USPC ......... 505/100, 150, 230, 236–239, 434, 470, 505/704; 428/469, 472, 701, 702; 427/62; 174/125.1
See application file for complete search history.

(56) References Cited

U.S. PATENT DOCUMENTS 5,157,466 A * 10/1992 Char et al. ........................ 257/33
6,537,689 B2 * 3/2003 Schoop et al. ................. 428/701
(Continued)

FOREIGN PATENT DOCUMENTS

JP    H03-069596 A    3/1991
JP    11-086647    *    3/1999    ............. H01B 12/06
(Continued)

OTHER PUBLICATIONS

Novoselov et al, "Synthesis of Substrate Materials Based on Rare-Earth-Containing Mixed-Oxide Solid Solutions for Epitaxy of High-Tc Superconductors," Inorganic Materials, 2009, vol. 45, No. 6, pp. 589-595.*

(Continued)

*Primary Examiner* — Colleen Dunn
(74) *Attorney, Agent, or Firm* — Amin, Turocy & Watson, LLP

(57) ABSTRACT

Impurities are reduced in an oxide superconducting layer and in an interface between the oxide superconducting layer and an intermediate layer. A superconducting wire rod 1 has a structure including a substrate (10), an intermediate layer (20) formed on the substrate (10), a reaction suppressing layer (28) formed on the intermediate layer (20) and mainly containing polycrystalline $SrLaFeO_{4+\delta 1}$ or $CaLaFeO_{4+\delta 2}$, in which the $\delta 1$ and the $\delta 2$ each represent an amount of non-stoichiometric oxygen, and an oxide superconducting layer (30) formed on the reaction suppressing layer (28) and mainly containing an oxide superconductor.

20 Claims, 3 Drawing Sheets

(51) Int. Cl.
  *H01L 39/24*  (2006.01)
  *H01B 13/30*  (2006.01)

(56) References Cited

U.S. PATENT DOCUMENTS

2004/0214450  A1*  10/2004  Suga et al. .................... 438/779
2009/0260851  A1   10/2009  Hahakura et al.

FOREIGN PATENT DOCUMENTS

| JP | H1186647    | A | 3/1999  |             |
| JP | 2003-323822 | * | 11/2003 | ............. H01B 12/06 |
| JP | 2003-323822 | A | 11/2003 |             |
| JP | 2007-311194 | * | 11/2007 | ............. H01B 12/06 |
| JP | 2007-311194 | A | 11/2007 |             |
| JP | 2010-103021 | * | 5/2010  | ............. H01B 12/06 |
| JP | 2010-103021 | A | 5/2010  |             |
| JP | 2011-009106 | * | 1/2011  | ............. H01B 12/06 |
| JP | 2011-009106 | A | 1/2011  |             |

OTHER PUBLICATIONS

International Search Report for PCT Application Serial No. PCT/JP2012/053435, dated Mar. 13, 2012, 4 pages (with translation).

* cited by examiner

SUPERCONDUCTING WIRE ROD AND METHOD FOR MANUFACTURING SUPERCONDUCTING WIRE ROD

CROSS-REFERENCE TO RELATED APPLICATION

This application is a U.S. National Stage of PCT Patent Application No. PCT/JP2012/053435, filed Feb. 14, 2012 and entitled "SUPER-CONDUCTING WIRE AND METHOD FOR PRODUCING SUPER-CONDUCTING WIRE"; which claims priority to Japanese Patent Application No. 2011-029845, filed Feb. 15, 2011. The entireties of the above-referenced applications are incorporated herein by reference.

TECHNICAL FIELD

The present invention relates to a superconducting wire rod used for a superconductive cable, a superconducting magnet and the like, and a method for manufacturing the superconducting wire rod.

BACKGROUND ART

Many attempts have been conventionally proposed to manufacture a superconducting wire rod by depositing a film of oxide superconductor on a substrate.

Among them, a superconducting wire rod obtained by depositing an oxide superconductor represented by a composition formula of $REBa_2Cu_3O_{7-\delta}$ (RE represents a rare-earth element; also referred to as 123-based or RE-based superconductor) on a tape-shaped metal substrate to have flexibility exhibits high degrees of current properties, and thus it is now one of superconducting wire rods on which research and development has been actively carried out. A number of prototypes for an electric power device or the like using such wire rods have already been manufactured.

The oxide superconductor has electrical anisotropy such that the flow of electricity is promoted along the crystal axes a and b of the crystals itself, but the flow of electricity is impeded along the crystal axis c of the crystals itself. Accordingly, when the oxide superconductor is formed on a substrate, it is necessary to orient the crystal axes a and b so as to promote the flow of electricity and orient the crystal axis c along another direction.

However, the substrate itself is an amorphous material or polycrystalline material that has a crystal structure significantly different from that of the oxide superconductor. Therefore, it is difficult to form an oxide superconductor exhibiting high degrees of crystalline orientation on the substrate. Differences in coefficients of thermal expansion and lattice constants between the substrate and the oxide superconductor may cause distortion in the superconductor or peeling-off of the oxide superconductor film from the substrate during a cooling process to a superconducting critical temperature.

As an approach to address these problems, an orientation layer (i.e. intermediate layer) is first provided on a metal substrate, and an oxide superconductor is formed on the oriented layer. The oriented layer is deposited, for example, by an ion beam assisted deposition method (IBAD method) using a material such as MgO which exhibits high degrees of orientation of the crystal axis c and high degrees of in-plane orientation of the crystal axis a (i.e. biaxial crystal orientation).

Patent Literature 1 discloses a technique to achieve a higher degree of biaxial crystal orientation, in which a cap layer made of $CeO_2$, $PrO_2$ or the like is formed on an oriented layer, and then an oxide superconducting layer made of an RE-based superconductor containing Ba is formed thereon.

Patent Literature 2 discloses a technique for forming a high quality oxide superconducting thin film of epitaxial single crystal on a substrate having a single crystal structure of $K_2MnF_4$. However, when, as in a superconducting wire rod, the superconducting material is relatively large in length (including an elongated wire) and needs to be flexible, it is difficult to use a single crystal for a substrate.

[Patent Literature 1] Japanese Patent Application Laid-Open (JP-A) No. 2010-103021
[Patent Literature 2] JP-A No. 1991-069596

SUMMARY OF INVENTION

However, in Patent Literature 1, the cap layer made of $CeO_2$, $PrO_2$ or the like is disposed directly below the oxide superconducting layer. Therefore, a rare-earth element contained in a constituent of the cap layer such as $CeO_2$ or $PrO_2$ may react with the Ba contained in the oxide superconducting layer during formation of the oxide superconducting layer or a heat treatment process of a superconducting wire rod. As a result, an impurity such as $BaCeO_3$ or $BaPrO_3$ is generated in the oxide superconducting layer or in the interface between the oxide superconducting layer and the intermediate layer (the cap layer), which adversely affects superconducting properties such as a critical current. Thus, the generation of an impurity due to the reaction between the intermediate layer (the cap layer) positioned directly below the oxide superconducting layer and the oxide superconducting layer adversely affects on the superconducting properties of the oxide superconducting layer. In other words, it is necessary to optimize the layer disposed directly below under the oxide superconducting layer so as to suppress impurities.

The present invention has been accomplished in view of the above circumstances and it is an object of the invention to provide a superconducting wire rod that contains fewer impurities in an oxide superconducting layer or in an interface between the oxide superconducting layer and an intermediate layer, and a method for manufacturing the superconducting wire rod.

The above problem of the invention has been solved by the following means.

<1> A superconducting wire rod comprising: a substrate; an intermediate layer formed on the substrate; a reaction suppressing layer formed on the intermediate layer and mainly containing polycrystalline $SrLaFeO_{4+\delta 1}$ or $CaLaFeO_{4+\delta 2}$, in which the $\delta 1$ and $\delta 2$ each represent an amount of non-stoichiometric oxygen; and an oxide superconducting layer formed on the reaction suppressing layer and mainly containing an oxide superconductor.

<2> The superconducting wire rod according to <1>, wherein the intermediate layer comprises a rare earth element that reacts with Ba, and the oxide superconducting layer comprises Ba.

<3> The superconducting wire rod according to <2>, wherein an outermost layer of the intermediate layer is a cap layer that mainly contains at least one selected from $CeO_2$ or $PrO_2$.

<4> The superconducting wire rod according to <2> or <3>, wherein the oxide superconductor is $REBa_2Cu_3O_{7-\delta 2}$, in which the RE represents a single rare earth element or a plurality of rare earth elements, and the $\delta 2$ represents an amount of non-stoichiometric oxygen.

The superconducting wire rod according to any one of <1> to <4>, wherein the reaction suppressing layer has a thickness of from 20 nm to 140 nm.

The superconducting wire rod according to any one of <3> to <5>, wherein a thickness of the reaction suppressing layer is smaller than a thickness of the cap layer.

<7> The superconducting wire rod according to any one of <1> to <6>, wherein crystal lattices of the $SrLaFeO_{4+\delta 1}$ and $CaLaFeO_{4+\delta 2}$ are cubic or orthorhombic.

<8> A method for manufacturing a superconducting wire rod comprising: forming an intermediate layer on a metal substrate; forming, on the intermediate layer, a reaction suppressing layer mainly containing polycrystalline $SrLaFeO_{4+\delta 1}$ or $CaLaFeO_{4+\delta 2}$, in which each of the $\delta 1$ and the $\delta 2$ represents an amount of non-stoichiometric oxygen; and forming an oxide superconducting layer mainly containing an oxide superconductor on the reaction suppressing layer.

<9> The method for manufacturing a superconducting wire rod according to <8>, wherein the intermediate layer comprises a rare earth element that reacts with Ba, and the oxide superconducting layer comprises Ba.

<10> The method for manufacturing a superconducting wire rod according to <9>, wherein an outermost layer of the intermediate layer is a cap layer mainly containing at least one selected from $CeO_2$ or $PrO_2$ The invention can provide a superconducting wire rod that contains fewer impurities in an oxide superconducting layer or in an interface between the oxide superconducting layer and an intermediate layer, and a method for manufacturing the superconducting wire rod.

DESCRIPTION OF EMBODIMENTS

Figure 1:
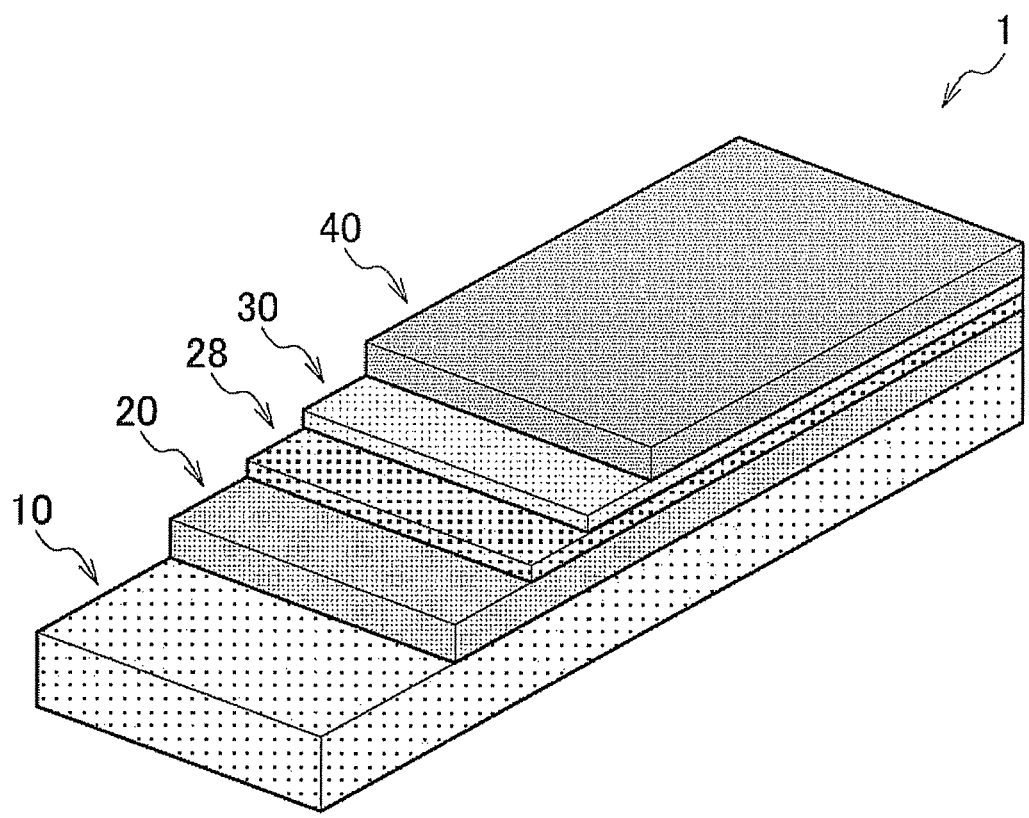
FIG. 1 is a diagram showing a multilayer configuration of a superconducting wire rod according to an embodiment of the invention.

A superconducting wire rod and a method for manufacturing the superconducting wire rod according to embodiments of the invention will be described in detail hereinafter with reference to the accompanying drawings. In the drawings, members (constituent elements) having the same or equivalent functions are given the same reference signs and descriptions thereof are omitted as needed.

(Structure of Superconducting Wire Rod and Method for Manufacturing the Same)

FIG. 1 is a diagram showing a multilayer configuration of a superconducting wire rod according to an embodiment of the invention.

As depicted in FIG. 1, a superconducting wire rod 1 has a multilayer configuration in which an intermediate layer 20, a reaction suppressing layer 28, an oxide superconducting layer 30, and a protection layer 40 are formed in this order on a tape-shaped substrate 10.

The substrate 10 is a low magnetic, non-oriented metal substrate or a non-oriented ceramic substrate. Not only a tape-shaped substrate as mentioned above, but a substrate having any of various shapes, such as shapes of a plate, a wire rod, and a slit may be used as the substrate 10. Examples of a material of the metal substrate include a metal having excellent strength and thermal resistance, such as Cu, Ni, Ti, Mo, Nb, Ta, W, Mn, Fe, and Ag, or an alloy thereof. Particularly preferred are stainless steel, HASTELLOY (registered trademark), and other nickel-based alloys, which have excellent corrosion resistance and thermal resistance. In addition, any of various ceramics may be arranged on any of these various metal materials. Examples of a material of the ceramic substrate include MgO, $SrTiO_3$, and yttrium-stabilized zirconia.

The intermediate layer 20 is a layer formed on the metal substrate 10 in order to achieve high degrees of in-plane orientation in the oxide superconducting layer 30. The specific layer structure thereof is described below.

The reaction suppressing layer 28 is a layer that mainly contains polycrystalline $SrLaFeO_{4+\delta 1}$ or $CaLaFeO_{4+\delta 2}$ and suppresses the generation of impurities in an interface between the oxide superconducting layer 30 and the intermediate layer 20. Here, the $\delta 1$ and the $\delta 2$ each represent an amount of non-stoichiometric oxygen.

The oxide superconducting layer 30 is formed on the reaction suppressing layer 28 formed on the intermediate layer 20 and mainly contains an oxide superconductor. The oxide superconductor is not particularly limited, while an oxide superconductor including Ba may be used. For example, a crystal material that is represented by a composition formula of $REBa_2Cu_3O_{7-\delta}$, $(La_{1-x}Ba_x)_2CuO_{4-\delta}$, $Ba(Pb,Bi)O_3$, or $Tl_2Ba_2Ca_{n-1}Cu_nO_{2n+4}$ (n represents an integer of 2 or more) may be used. Here, these crystal materials may be combined together to form a copper oxide superconductor.

The phrase "mainly contain(s)" means that the proportion of the oxide superconductor in the oxide superconducting layer 30 is 80% by mass or more.

The RE in the $REBa_2Cu_3O_{7-\delta}$ represents a single rare earth element or plural rare earth elements such as Y, Nd, Sm, Eu, Gd, Dy, Ho, Er, Tm, Yb, or Lu, or plural rare-earth elements selected therefrom. Among these, Y is preferable for reasons such as causing no substitution with a Ba site and a high superconducting transition temperature Tc thereof. $\delta$ represents an amount of non-stoichiometric oxygen. For example, $\delta$ is from 0 to 1. From the viewpoint of having a high superconducting transition temperature, the closer to zero the is, the more preferable it is. At present, it is only in $PrBa_2Cu_3O_{7-\delta}$ including Pr as RE that superconductivity phenomenon has not been observed. When the superconductivity phenomenon is observed in the future by regulating the amount of non-stoichiometric oxygen $\delta$ or in any other way, $PrBa_2Cu_3O_{7-\delta}$ shall then be included in oxide superconductors according to embodiments of the invention.

In addition, $\delta$ of crystal materials other than $PrBa_2Cu_3O_{7-\delta}$ also represents an amount of non-stoichiometric oxygen. For example, $\delta$ is from 0 to 1.

The film thickness of the oxide superconducting layer 30 is not particularly limited. For example, it is from 100 nm to 6,000 nm.

Examples of a method of forming (depositing) the oxide superconducting layer 30 include methods such as TFA-MOD, PLD, CVD, MOCVD, and sputtering. Among these deposition methods, preferred is MOCVD since the method does not require high degrees of vacuum, allows deposition even on a substrate 10 having a large area and/or a complicated shape, and is excellent in mass productivity. Conditions for deposition using MOCVD are appropriately determined according to the constituent materials, film thickness, and the like of the oxide superconducting layer 30. An example of the conditions therefor is as follows: a wire rod conveying speed of from 80 m/h to 500 m/h, and a deposition temperature of from 800° C. to 900° C. (in a case in which $YBa_2Cu_3O_{7-\delta}$ is deposited). In addition, deposition of $REBa_2Cu_3O_{7-\delta}$ or $(La_{1-x}Ba_x)_2CuO_{4-\delta}$ is preferably performed in an oxygen gas atmosphere, from the viewpoint of reducing the amount of non-stoichiometric oxygen δ to improve superconducting properties.

On an upper surface of the oxide superconducting layer 30, the protection layer 40 made of silver and deposited by, for example, sputtering is present. In addition, after the depositing of the protection layer 40 to manufacture the superconducting wire rod 1, the superconducting wire rod 1 may be subjected to a thermal treatment.

Figure 2:
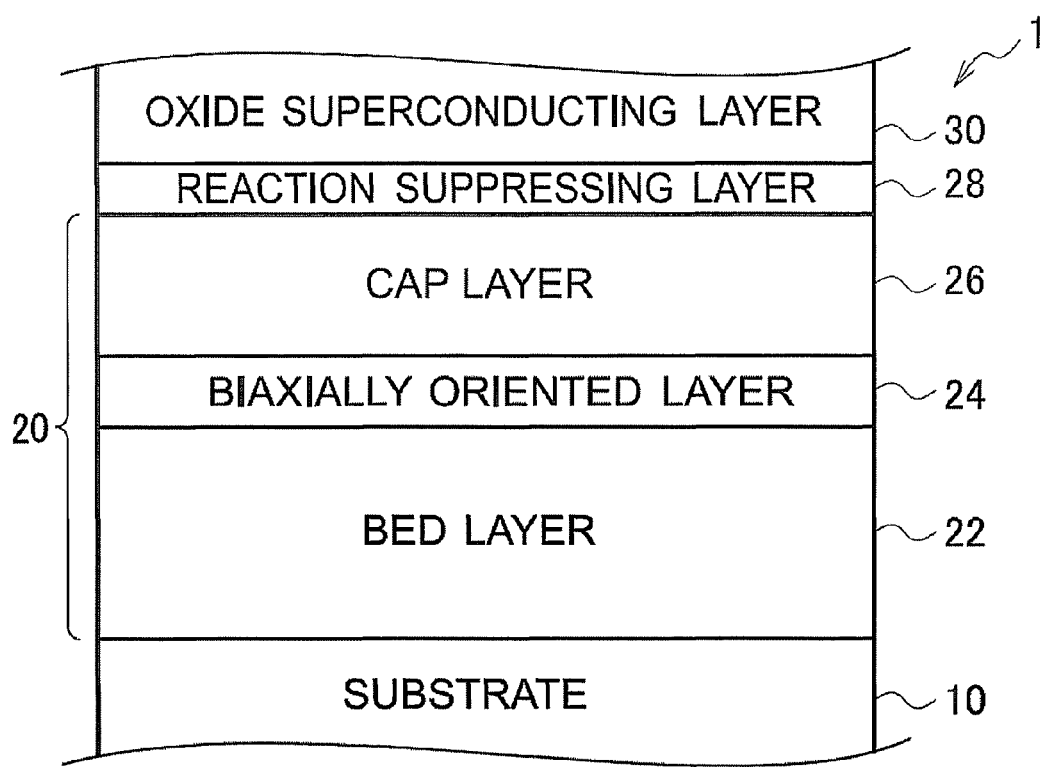
FIG. 2 is a detailed cross-sectional view of the multilayer configuration of the superconducting wire rod shown in FIG. 1.

Detailed Configuration of Superconducting Wire Rod and Method for Manufacturing the Same FIG. 2 is a detailed cross-sectional view of the multilayer configuration of the superconducting wire rod 1 shown in FIG. 1.

As depicted in FIG. 2, the intermediate layer 20 of the superconducting wire rod 1 is includes a bed layer 22, a biaxially oriented layer 24, and a cap layer 26.

The bed layer 22, which is formed on the substrate 10, is a layer for preventing diffusion of a constituent elements of the substrate 10. Examples of a constituent material of the bed layer 22 include $Gd_2Zr_2O_{7-\delta}$ (−1<δ<1, hereinafter referred to as "GZO"), $YAlO_3$ (yttrium aluminate), YSZ (yttria-stabilized zirconia), $Y_2O_3$, $Gd_2O_3$, $Al_2O_3$, $B_2O_3$, $Sc_2O_3$, $Cr_2O_3$, REZrO, and $RE_2O_3$. The RE represents a single rare earth element or plural rare earth elements. In addition to the diffusion preventing function, the bed layer 22 may have another function such as a function of improving biaxial orientation property. In order to impart the function of improving biaxial orientation property, it is preferable to use GZO as the constituent material of the bed layer 22.

The film thickness of the bed layer 22 is not particularly limited. For example, it is from 20 nm to 200 nm.

Examples of a method for forming (depositing) the bed layer 22 include deposition by an RF sputtering method in an argon atmosphere.

In the RF sputtering method, inert gas ions (such as $Ar^+$) generated by plasma discharge are collided with an evaporation source (such as GZO) to sputter evaporated particles, which in turn deposit on a deposition surface to form a film. Conditions for the deposition at that time are appropriately determined according to the constituent materials, film thickness, and/or the like of the bed layer 22. An example of the conditions thereof is as follows: an RF sputtering output of from 100 W to 500 W, a wire rod conveying speed of from 10 m/h to 100 m/h, and a deposition temperature of from 20° C. to 500° C.

An ion-beam sputtering method in which ions generated by an ion generator (ion gun) are collided with an evaporation source may be used for deposition of the bed layer 22. The bed layer 22 may have a multilayer configuration such as a combination of a $Y_2O_3$ layer and an $Al_2O_3$ layer.

The biaxially oriented layer 24, which is formed on the bed layer 22, is a layer for orienting crystals in the oxide superconducting layer 30 in a given direction. Examples of a constituent material of the biaxially oriented layer 24 include polycrystalline materials such as NbO and MgO. Alternatively, the same material as that of the bed layer 22, such as GZO, may be used.

The film thickness of the biaxially oriented layer 24 is not particularly limited. For example, it is from 1 nm to 20 nm.

Examples of a method for forming (depositing) the biaxially oriented layer 24 include a deposition method by an ion beam-assisted deposition (IBAD) method in an atmosphere of argon, oxygen, or a mixed gas of argon and oxygen. In the IBAD method, evaporated particles sputtered from an evaporation source (such as MgO) by RF sputtering (or ion beam sputtering) are deposited on a deposition surface while applying an assist ion beam at a tilted angle onto the deposition surface to form a film. Deposition conditions at that time are appropriately determined according to the constituent materials, film thickness, and/or the like of the biaxially oriented layer 24. An example of the deposition conditions is as follows: an assist ion beam voltage of from 800 V to 1,500 V, an assist ion beam current of from 80 mA to 350 mA, an assist ion beam accelerating voltage of 200 V, an RF sputtering output of from 800 to 1,500 W, a wire rod conveying speed of from 40 to 500 m/h, and a deposition temperature of from 5 to 350° C.

The biaxially oriented layer 24 can be deposited using reactive sputtering in which, using, for example, Mg, as an evaporation source, sputtering is performed in a mixed gas atmosphere of argon and oxygen, whereby the particles of Mg flicked out are allowed to react with oxygen to deposit a film of MgO. In addition, the biaxially oriented layer 24 may be a composite layer including a layer deposited by an epitaxial method and a layer deposited by IBAD.

The cap layer 26 is a layer formed on the biaxially oriented layer 24 to protect the biaxially oriented layer 24 and increase lattice matching with the oxide superconducting layer 30. For example, the cap layer 26 is composed of a fluorite-type crystal structure which includes a rare earth element that reacts with Ba and has self-epitaxy. The fluorite-type crystal structure is, for example, at least one selected from $CeO_2$ and $PrO_2$. The cap layer 26 may further contain any impurity even when mainly including the fluorite-type crystal structure.

The film thickness of the cap layer 26 is not particularly limited. In order to obtain sufficient orientation properties, the thickness thereof is preferably 50 nm or more, and more preferably 300 nm or more. However, when the film thickness thereof exceeds 600 nm, deposition time increases, so that preferred is 600 nm or less.

Examples of a method for forming (depositing) the cap layer 26 include deposition by PLD and deposition by RF sputtering. Conditions for deposition by RF sputtering are appropriately determined according to the constituent material, film thickness, and the like of the cap layer 26. An example of the conditions thereof is as follows: an RF sputtering output of from 200 W to 1,000 W, a wire rod conveying speed of from 2 m/h to 50 m/h, and a deposition temperature of from 450° C. to 800° C.

The reaction suppressing layer 28 according to an embodiment of the invention is provided on the cap layer 26 which is the outmost layer of the intermediate layer 20 described above.

The reaction suppressing layer 28 is a layer formed between the cap layer 26 and the oxide superconducting layer 30 and suppresses reaction between, particularly, the cap layer 26 in the intermediate layer 20 and the oxide superconducting layer 30. For example, the reaction suppressing layer 28 is a layer for suppressing reaction between a rare earth element included in the fluorite-type crystal structure constituting the cap layer 26 and Ba included in the oxide superconducting layer 30. Regarding the term "suppress", it is enough as long as the reaction with Ba is suppressed compared to a case in which the reaction suppressing layer 28 is not formed between the oxide superconducting layer 30 and the cap layer 26, and complete prevention of the reaction with Ba is not necessarily needed.

The reaction suppressing layer 28 is not limited as long as the layer mainly contains $SrLaFeO_{4+\delta 1}$ or $CaLaFeO_{4+\delta 2}$. The δ1 in $SrLaFeO_{4+\delta 1}$ and the δ2 in $CaLaFeO_{4+\delta 2}$ each represent an amount of non-stoichiometric oxygen, which being, for example, from 0 to 1. The phrase "mainly contain" means that the proportion of $SrLaFeO_{4+\delta 1}$ or $CaLaFeO_{4+\delta 2}$ in the reaction suppressing layer 28 is 80% by mass or more. From the viewpoint of ensuring the suppression of the above reaction, the reaction suppressing layer 28 is preferably made of $SrLaFeO_{4+\delta 1}$ or $CaLaFeO_{4+\delta 2}$. In other words, the proportion of $SrLaFeO_{4+\delta 1}$ or $CaLaFeO_{4+\delta 2}$ in the reaction suppressing layer 28 is preferably 100% by mass.

The crystal structures of the $SrLaFeO_{4+\delta 1}$ and $CaLaFe_{4+\delta 2}$ can be of cubic, orthorhombic, or rhombohedral. From the viewpoint of improving an orientation rate of the upper layer (the oxide superconducting layer 30), preferred is a cubic crystal structure, particularly when the oxide superconducting layer 30 is forming.

The thickness of the reaction suppressing layer 28 is not particularly limited. It is preferably from 20 nm or more from the viewpoint of effectively suppressing the reaction between the rare earth element included in the fluorite-type crystal structure constituting the cap layer 26 and Ba included in the oxide superconducting layer 30. The thickness thereof is preferably 100 nm or less from the viewpoint of suppressing surface roughness of the reaction suppressing layer 28. Although the reaction suppressing layer 28 has high degrees of orientation similarly to the cap layer 26, it is preferable that the thickness of the reaction suppressing layer 28 is smaller than the thickness of the cap layer 26 so as to reliably preserve the orientation of the cap layer 26 in the oxide superconducting layer 30.

In the reaction suppressing layer 28, the smaller the amount of the rare earth element that may react with Ba, the better. The content of the rare earth element in the reaction suppressing layer 28 is, for example, preferably 10% or less, more preferably 5% or less, and still more preferably 1% or less.

As long as the amount of the rare earth element is in the above ranges, a reaction between the rare earth element in the reaction suppressing layer 28 and the oxide superconducting layer 30 can be suppressed even when the rare earth element included in the fluorite-type crystal structure constituting the cap layer 26 penetrates into the reaction suppressing layer 28.

From the viewpoint of suppressing diffusion (passage through the reaction suppressing layer 28) of the rare earth element contained in the fluorite-type crystal structure constituting the cap layer 26, the smaller the porosity of the reaction suppressing layer 28, the better. The porosity is preferably 5% or less, more preferably 1% or less, further preferably 0.1% or less, and still more preferably 0.01% or less.

When Ba contained in the oxide superconducting layer 30 is substituted for Sr or Ca included in the reaction suppressing layer 28, the result is that $BaLaFeO_{4+\delta 3}$ is present in the reaction suppressing layer 28. The δ3 represents an amount of non-stoichiometric oxygen. The $BaLaFeO_{4+\delta 3}$ has a lattice constant of approximately 0.391 nm.

Examples of lattice constants of a-axis and b-axis in each material composition for the oxide superconducting layer 30 are as follows:

$LaBa_2Cu_3O_{6.7}$ (a=b=0.390 nm)
$YBa_2Cu_3O_{6.98}$ (a=b=0.388 nm)
$GdBa_2Cu_3O_{6.84}$ (a=b=0.391 nm)
$PrBa_2Cu_3O_{6.9}$ (a=b=0.390 nm)
$NdBa_2Cu_3O_{6.88}$ (a=0.391 nm, b=0.391 nm)
$ErBa_2Cu_3O_{6.98}$ (a=0.382 nm, b=0.389 nm)
$HoBa_2Cu_3O_{6.78}$ (a=0.381 nm, b=0.388 nm)
$DyBa_2Cu_3O_{6.96}$ (a=0.382 nm, b=0.388 nm)
$TmBa_2Cu_3O_7$ (a=0.381 nm, b=0.388 nm)
$ErBa_2Cu_3O_7$ (a=0.382 nm, b=0.388 nm)
$HoBa_2Cu_3O_7$ (a=0.382 nm, b=0.389 nm)
$DyBa_2Cu_3O_7$ (a=0.382 nm, b=0.389 nm)
$GdBa_2Cu_3O_7$ (a=0.384 nm, b=0.390 nm)
$EuBa_2Cu_3O_7$ (a=0.384 nm, b=0.390 nm)
$SmBa_2Cu_3O_7$ (a=0.385 nm, b=0.391 nm)
$NdBa_2Cu_3O_7$ (a=0.386 nm, b=0.392 nm)
$PrBa_2Cu_3O_7$ (a=0.386 nm, b=0.393 nm)
$LaBa_2Cu_3O_7$ (a=0.389 nm, b=0.394 nm)

As mentioned below, the lattice constants of the a-axis and the b-axis of the oxide superconducting layer 30 are approximately from 0.38 nm to 0.39 nm. Accordingly, even when $BaLaFeO_{4+\delta 3}$ is formed in the interface between the reaction suppressing layer 28 and the oxide superconducting layer 30, the lattice constant thereof is very close to the lattice constant of the oxide superconducting layer 30 and thus generation of differently oriented crystal, such as a-axis particles, can be suppressed.

Examples of a method for forming (depositing) the reaction suppressing layer 28 include deposition by PLD and deposition by sputtering. Conditions for deposition by sputtering are appropriately determined by the constituent material, film thickness, and/or the like of the reaction suppressing layer 28. An example of conditions therefor is as follows: a sputtering output of from 100 W to 200 W, a wire rod conveying speed of from 18 m/h to 180 m/h, a deposition temperature of from 600° C. to 900° C., and a deposition atmosphere of Ar gas at a pressure of from 0.1 Pa to 1.0 Pa. In addition, the sputtering target is the constituent material of the reaction suppressing layer 28 described above.

(Effects)

In the present embodiments, since the reaction suppressing layer 28 is formed between the oxide superconducting layer 30 and the cap layer 26 as described above, for example, the rare earth element included in the fluorite-type crystal structure constituting the cap layer 26 hardly diffuses, so that the reaction between the rare earth element and Ba included in the oxide superconducting layer is suppressed. Accordingly, there are no or less impurities such as $BaCeO_3$ and $BaPrO_3$ in the oxide superconducting layer 30 and in the interface between the oxide superconducting layer 30 and the cap layer 26 as compared to the case in which the reaction suppressing layer 28 is not formed.

Figure 3A:
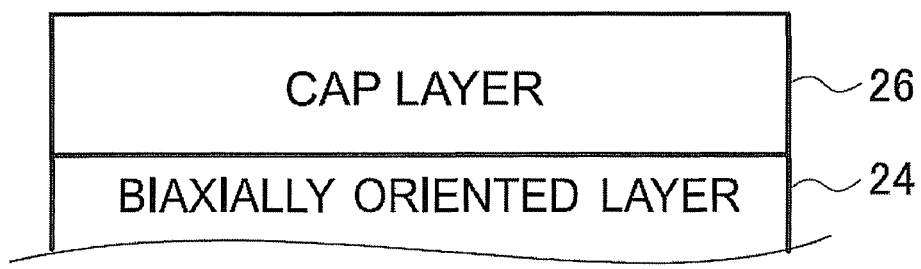
FIG. 3A is a diagram showing a manufacturing process and a multilayer configuration of a conventional superconducting wire rod.
Figure 3B:
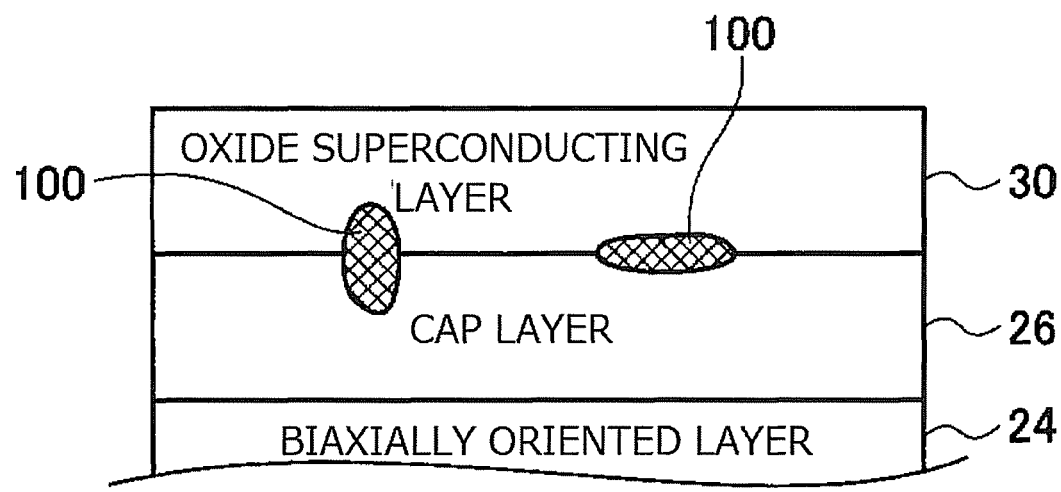
FIG. 3B is a diagram showing the manufacturing process and the multilayer configuration of the conventional superconducting wire rod following FIG. 3A.

When the reaction suppressing layer 28 is not present, the reaction between the rare-earth element and Ba included in the oxide superconducting layer 30 may occur in the thermal treatment process or during storing at high temperature after manufacturing the superconducting wire rod 1. Particularly, as depicted in FIGS. 3A and 3B, the reaction occurs during the formation of the oxide superconducting layer 30 that requires heating of the substrate 10 to increase deposition temperature. Reference signs 100 in the figures each represent an impurity generated by the reaction between the rare earth element included in the fluorite-type crystal structure constituting the cap layer 26 and Ba included in the oxide superconducting layer.

On the other hand, in the present embodiments, the above reaction can be suppressed even during the formation of the oxide superconducting layer 30 since a base on which the oxide superconducting layer 30 is formed is not the cap layer 26 but the reaction suppressing layer 28.

(Modifications)

While the specific embodiments of the invention have been described in detail, the invention is not limited thereto. It will be obvious to those skilled in the art that other various embodiments are possible within the scope of the invention. For example, the plural embodiments described above may be appropriately combined with one another to implement the invention. Alternatively, the following modifications may be appropriately combined with one another.

A lattice matching layer containing at least one selected from $LaMnO_{3+\delta}$ (abbreviated to LMO) or $SrTiO_{3+\delta}$ (abbreviated to STO) may be provided between the biaxially oriented layer 24 and the cap layer 26 in order to improve the lattice matching of the cap layer 26.

The oxygen non-stoichiometries $\delta$ of the $YBa_2Cu_3O_{7-\delta}$ and the like may represent a negative value, although the above description has been given of a case in which the $\delta$ mentioned above is 0 or more (when the $\delta$ represents a positive value).

An oriented metal substrate may be used as the substrate 10, and an intermediate layer 20 composed of $CeO_2$ or $PrO_2$/$YSZ/CeO_2$ or $PrO_2$ may be formed on the substrate 10. In this case, the substrate 10 is desirably made of Ag, Ni, or an alloy thereof, but not limited thereto as long as the substrate is an in-plane oriented metal substrate. The structure of the intermediate layer 20 is not limited to the one described above and may be any as long as the structure thereof can suppress a diffusion reaction of the metal substrate 10 and the oxide superconducting layer 30 and can control the orientation of the oxide superconducting layer 30.

Additionally, another layer may be added between the cap layer 26 and the reaction suppressing layer 28.

The reaction suppressing layer 28 may be composed of plural layers using $SrLaFeO_4$ and $CaLaFeO_4$. In this case, the less number of layers is preferred. Thus, in a case of including two layers, it is preferable that a layer of $CaLaFeO_4$ is formed on the cap layer 26, and a layer of $SrLaFeO_4$ is then formed thereon. This is due to that, when the cap layer 26 is made of $CeO_2$, the lattice constant of $CaLaFeO_4$ is closer to the lattice constant of $CeO_2$ and the lattice constant of $SrLaFeO_4$ is closer to the lattice constant of the oxide superconducting layer 30. As a result, favorable lattice matching from the cap layer 26 to the oxide superconducting layer 30 is obtained, as well as an impurity of $BaCeO_3$ is hardly generated in the interface between the cap layer 26 and the oxide superconducting layer 30.

The disclosure of Japanese Patent Application No. 2011-029845 is incorporated herein by reference in its entirety.

All documents, patent applications, and technical standards described in the present description are incorporated herein by reference to the same extent as if each individual document, patent application or technical standard were specifically and individually indicated to be incorporated by reference.

EXAMPLES

Hereinafter, the superconducting wire rod according to the invention and the manufacturing method thereof are described with reference to Examples. However, the invention is not limited thereto at all.

Table 1 indicates Examples and Comparative Examples.

TABLE 1

|  |  | Structure | Reaction suppression layer (nm) | $BaCeO_3$ | Ra | Ic |
|---|---|---|---|---|---|---|
| Ex. | 1-1 | $YBCO/SrLaFeO_4/CeO_2$/IBAD-GZO/substrate | 10 | B | A | A |
|  | 1-2 | $YBCO/SrLaFeO_4/CeO_2$/IBAD-GZO/substrate | 20 | A | A | S |
|  | 1-3 | $YBCO/SrLaFeO_4/CeO_2$/IBAD-GZO/substrate | 50 | A | A | S |
|  | 1-4 | $YBCO/SrLaFeO_4/CeO_2$/IBAD-GZO/substrate | 80 | A | A | S |
|  | 1-5 | $YBCO/SrLaFeO_4/CeO_2$/IBAD-GZO/substrate | 100 | A | A | S |
|  | 1-6 | $YBCO/SrLaFeO_4/CeO_2$/IBAD-GZO/substrate | 140 | A | A | S |
|  | 1-7 | $YBCO/SrLaFeO_4/CeO_2$/IBAD-GZO/substrate | 180 | A | B | A |
|  | 2 | $YBCO/SrLaFeO_4/CeO_2$/IBAD-MgO/GZO/substrate | 60 | A | A | S |
|  | 3-1 | $YBCO/SrLaFeO_4/CeO_2$/LMO/IBAD-MgO/GZO/substrate | 10 | B | A | A |
|  | 3-2 | $YBCO/SrLaFeO_4/CeO_2$/LMO/IBAD-MgO/GZO/substrate | 20 | A | A | S |
|  | 3-3 | $YBCO/SrLaFeO_4/CeO_2$/LMO/IBAD-MgO/GZO/substrate | 50 | A | A | S |
|  | 3-4 | $YBCO/SrLaFeO_4/CeO_2$/LMO/IBAD-MgO/GZO/substrate | 80 | A | A | S |
|  | 3-5 | $YBCO/SrLaFeO_4/CeO_2$/LMO/IBAD-MgO/GZO/substrate | 100 | A | A | S |
|  | 3-6 | $YBCO/SrLaFeO_4/CeO_2$/LMO/IBAD-MgO/GZO/substrate | 140 | A | A | S |
|  | 3-7 | $YBCO/SrLaFeO_4/CeO_2$/LMO/IBAD-MgO/GZO/substrate | 180 | A | B | A |
|  | 4-1 | $YBCO/CaLaFeO_4/CeO_2$/IBAD-GZO/substrate | 10 | B | A | A |
|  | 4-2 | $YBCO/CaLaFeO_4/CeO_2$/IBAD-GZO/substrate | 20 | A | A | S |
|  | 4-3 | $YBCO/CaLaFeO_4/CeO_2$/IBAD-GZO/substrate | 50 | A | A | S |
|  | 4-4 | $YBCO/CaLaFeO_4/CeO_2$/IBAD-GZO/substrate | 80 | A | A | S |
|  | 4-5 | $YBCO/CaLaFeO_4/CeO_2$/IBAD-GZO/substrate | 100 | A | A | S |
|  | 4-6 | $YBCO/CaLaFeO_4/CeO_2$/IBAD-GZO/substrate | 140 | A | A | S |
|  | 4-7 | $YBCO/CaLaFeO_4/CeO_2$/IBAD-GZO/substrate | 180 | A | B | A |
| Comp. Ex | 1 | $YBCO/CeO_2$/IBAD-GZO/substrate | — | C | A | B |
|  | 2 | $YBCO/CeO_2$/IBAD-MgO/GZO/substrate | — | C | A | B |
|  | 3 | $YBCO/CeO_2$/LMO/IBAD-MgO/GZO/substrate | — | C | A | B |

Examples 1-1 to 1-7

In each of Examples 1-1 to 1-7, a HASTELLOY metal substrate as the substrate 10 was introduced in an IBAD device, and the IBAD device was evacuated to a vacuum degree of $1 \times 10^{-3}$ Pa. Then, a biaxially oriented layer 24 made of GZO was deposited by IBAD using GZO as an evacuation source at room temperature at a wire rod conveying speed of 3 m/h to have a film thickness of 800 nm. The biaxially oriented layer 24 may be referred to as IBAD-GZO. In Examples 1, the bed layer 22 not formed.

Subsequently, the substrate 10 on which the biaxially-oriented layer 24 is deposited was introduced into a sputtering device, and the sputtering device was vacuumed to $1 \times 10^{-3}$ Pa. Then, a cap layer 26 made of $CeO_2$ was deposited by an RF sputtering method with the use of $CeO_2$ as an evaporation source to have a film thickness of 500 nm.

Specifically, deposition of the $CeO_2$ film by the RF sputtering method was performed under conditions of a temperature of about 700° C., an atmosphere of mixed gas of argon and oxygen of about 0.3 Pa, sputtering output of about 800 W, and a wire rod conveying speed of 7 m/h or less.

Next, the substrate 10 over which the cap layer 26 was deposited was introduced in an RF sputtering device, the RF sputtering device was vacuumed to $1 \times 10^{-3}$ Pa. Then, a reaction suppressing layer 28 made of cubic polycrystalline $SrLaFeO_{4+\delta 1}$ was deposited by an RF sputtering method with the use of $SrLaFeO_{4+\delta 1}$ as an evaporation source to have respective film thicknesses.

Specifically, the deposition of the $SrLaFeO_{4+\delta 1}$ film by RF sputtering was performed under conditions of a temperature of about 900° C., an atmosphere of Ar gas of about 0.5 Pa, sputtering output of about 200 W, and a wire rod conveying speed of from 10 m/h to 360 m/h. The film thicknesses were set to be 10, 20, 50, 80, 100, 140, and 180 nm, respectively.

Finally, the substrate 10 over which the reaction suppressing layer 28 is deposited was introduced into an MOCVD device, and, with the use of $(Y_{0.7}Gd_{0.3})Ba_2Cu_3O_{7-\delta}$ (hereinafter, referred to as YBCO) as an evaporation source, an oxide superconducting layer 30 made of YBCO was deposited by an MOCVD method to have a film thickness of 1,000 nm.

Specifically, deposition of the YBCO film by the MOCVD method was performed under conditions of a temperature of about 800° C., an atmosphere of $O_2$ gas, and a wire rod conveying speed within the range of from 10 m/h to 500 m/h.

The superconducting wire rod according to each of Examples 1-1 to 1-7 of the invention was obtained through the above manufacturing processes.

Example 2

A HASTELLOY metal substrate as the substrate 10 was introduced into an ion-beam sputtering deposition device, and the ion-beam sputtering deposition device was vacuumed to $1 \times 10^{-3}$ Pa. Then, a bed layer 22 made of GZO was deposited by an ion-beam sputtering method with the use of GZO as an evaporation source at room temperature and a wire rod conveying speed of 30 m/h to have a film thickness of 100 nm.

Next, the substrate 10 on which the bed layer 22 is deposited was introduced into an IBAD device, and the IBAD device was vacuumed to $1 \times 10^{-4}$ Pa. Then, a biaxially-oriented layer 24 made of MgO was deposited by an IBAD method with the use of MgO as an evaporation source at room temperature and a wire rod conveying speed of 80 m/h to have a film thickness of 5 nm.

Then, a cap layer 26, a reaction suppressing layer 28, and an oxide superconducting layer 30 were deposited on the biaxially-oriented layer 24 in this order in a manner similar to Example 1. However, a film thickness of the reaction suppressing layer 28 was changed to 60 nm.

The superconducting wire rod according to Example 2 of the invention was obtained through the above manufacturing processes.

Examples 3-1 to 3-7

A HASTELLOY metal substrate as the substrate 10 was introduced into an ion-beam sputtering deposition device, and the ion-beam sputtering deposition device was vacuumed to $1 \times 10^{-3}$ Pa. Then, a bed layer 22 made of GZO was deposited by an ion-beam sputtering method with the use of GZO as an evaporation source at room temperature and a wire rod conveying speed of 30 m/h to have a film thickness of 100 nm.

Next, the substrate 10 on which the bed layer 22 is deposited was introduced into an IBAD device, and the IBAD device was vacuumed to $1 \times 10^{-4}$ Pa. Then, a biaxially-oriented layer 24 made of MgO was deposited by an IBAD method with the use of MgO as an evaporation source at room temperature and a wire rod conveying speed of 80 m/h to have a film thickness of 5 nm.

Next, the substrate 10 over which the biaxially-oriented layer 24 is deposited was introduced into an RF sputtering device, and the RF sputtering device was vacuumed to $1 \times 10^{-3}$ Pa. Then, in order to improve the lattice matching properties of a cap layer 26 to be formed thereon, a lattice matching layer made of $SrLaFeO_{4+\delta 1}$ was deposited by an RF sputtering method with the use of $SrLaFeO_{4+\delta 1}$ as an evaporation source to have a film thickness of 30 nm.

Specifically, deposition of the $SrLaFeO_{4+\delta 1}$ film by the RF sputtering method was performed under conditions of a temperature of about 900° C., an atmosphere of Ar gas of about 0.5 Pa, sputtering output of about 200 W, and a wire rod conveying speed of 60 m/h.

Then, a cap layer 26, a reaction suppressing layer 28, and an oxide superconducting layer 30 were deposited on the lattice matching layer in this order in a manner similar to Example 1. However, a film thickness of the reaction suppressing layer 28 in each of Examples 3-1 to 3-7 was varied. In particular, the film thicknesses were set to be 5, 10, 30, 60, 80, 100, and 180 nm, respectively.

The superconducting wire rod according to each of Examples 3-1 to 3-7 of the invention was obtained through the above manufacturing processes.

Examples 4-1 to 4-7

In each of Examples 4-1 to 4-7, a HASTELLOY metal substrate as the substrate 10 was introduced in an IBAD device, and the IBAD device was evacuated to a vacuum degree of $1 \times 10^{-3}$ Pa. Then, a biaxially oriented layer 24 made of GZO was deposited by IBAD using GZO as an evacuation source at room temperature at a wire rod conveying speed of 3 m/h to have a film thickness of 800 nm. The biaxially oriented layer 24 may be referred to as IBAD-GZO. In Examples 1, the bed layer 22 not formed.

Subsequently, the substrate 10 on which the biaxially-oriented layer 24 is deposited was introduced into a sputtering device, and the sputtering device was vacuumed to $1 \times 10^{-3}$ Pa. Then, a cap layer 26 made of $CeO_2$ was deposited by an RF sputtering method with the use of $CeO_2$ as an evaporation source to have a film thickness of 500 nm.

Specifically, deposition of the $CeO_2$ film by the RF sputtering method was performed under conditions of a temperature of about 700° C., an atmosphere of mixed gas of argon and oxygen of about 0.3 Pa, sputtering output of about 800 W, and a wire rod conveying speed of 7 m/h or less.

Next, the substrate 10 over which the cap layer 26 was deposited was introduced in an RF sputtering device, the RF sputtering device was vacuumed to $1\times10^{-3}$ Pa. Then, a reaction suppressing layer 28 made of cubic $CaLaFeO_{4+\delta2}$ was deposited by an RF sputtering method with the use of $CaLaFeO_{4+\delta2}$ as an evaporation source to have respective film thicknesses.

Specifically, the deposition of the $CaLaFeO_{4+\delta2}$ film by RF sputtering was performed under conditions of a temperature of about 900° C., an atmosphere of Ar gas of about 0.5 Pa, sputtering output of about 200 W, and a wire rod conveying speed of from 10 m/h to 360 m/h. The film thicknesses were set to be 5, 10, 30, 60, 80, 100, and 180 nm, respectively.

Finally, the substrate 10 over which the reaction suppressing layer 28 is deposited was introduced into an MOCVD device, and, with the use of $(Y_{0.7}Gd_{0.3})Ba_2Cu_3O_{7-\delta}$ (hereinafter, referred to as YBCO) as an evaporation source, an oxide superconducting layer 30 made of YBCO was deposited by an MOCVD method to have a film thickness of 1,000 nm.

Specifically, deposition of the YBCO film by the MOCVD method was performed under conditions of a temperature of about 800° C., an atmosphere of $O_2$ gas, and a wire rod conveying speed within the range of from 10 m/h to 500 m/h.

The superconducting wire rod according to each of Examples 4-1 to 4-7 of the invention was obtained through the above manufacturing processes.

Comparative Examples 1 to 3

A superconducting wire rod not including the reaction suppressing layer 28 in the structure of the superconducting wire rod of Example 1 was manufactured as Comparative Example 1.

A superconducting wire rod not including the reaction suppressing layer 28 in the structure of the superconducting wire rod of Example 2 was manufactured as Comparative Example 2.

A superconducting wire rod not including the reaction suppressing layer 28 in the structure of the superconducting wire rod of Example 3 was manufactured as Comparative Example 3.

(Evaluation Methods and Evaluation Results)

Hereinafter, evaluation methods and evaluation results of the respective superconducting wire rods manufactured in Examples 1-1 to 1-7, Example 2, Examples 3-1 to 3-7, Examples 4-1 to 4-7, and Comparative Examples 1 to 3 are described.

(1) X-Ray Diffraction Measurement

With respect to the oxide superconducting layer 30 of the superconducting wire rod according to each of the Examples and Comparative Examples, an X-ray diffraction measurement was performed by using an X-ray diffractometer RINT-ULTIMA III manufactured by Rigaku Corporation.

Specifically, the measurement was performed with the X-ray diffractometer by using $CuK\alpha$ ray under conditions of a tube voltage of 40 kV, a tube current of 40 mA, a scanning speed of 2.0 deg/min, a receiving slit of 0.15 mm, and a scanning range $2\theta$ of 5° to 135° to obtain an X-ray diffraction pattern of each superconducting wire rod.

The measurement revealed that each superconducting layer 30 is formed of a YBCO oxide superconductor.

The results of precipitation (generation) of an impurity $BaCeO_3$ are shown in Table 1 above. In Table 1, a case in which no peak belonging to $BaCeO_3$ was observed was represented by "A", a case in which a maximum peak of $BaCeO_3$ is more than 0 cps and less than 100 cps was represented by "B", and a case in which a maximum peak of $BaCeO_3$ is 100 cps or more was represented by "C", with respect to each X-ray diffraction pattern.

The results in Table 1 confirmed that the superconducting wire rods according to Examples 1-1 to 1-7, Example 2, Examples 3-1 to 3-7, Examples 4-1 to 4-7 suppressed the generation of the impurity $BaCeO_3$ as compared to Comparative Examples 1 to 3 not including the reaction suppressing layer 28. In addition, it was confirmed that, among Examples 1-1 to 1-7, Example 2, Examples 3-1 to 3-7, and Examples 4-1 to 4-7, in terms of eliminating the generation of the impurity $BaCeO_3$, preferred are the superconducting wire rods of Examples 1-2 to 1-7, Example 2, Examples 3-2 to 3-7, and Examples 4-2 to 4-7 including the reaction suppressing layers 28 with a film thickness of 20 nm or more.

(2) Surface Roughness Measurement

Regarding the superconducting wire rods according to the respective Examples and Comparative Examples, a surface roughness Ra of each reaction suppressing layer 28 was measured using an AFM image of the each reaction suppressing layer 28 obtained by an atomic force microscope (AFM, MOBILE S manufactured by Nanosurf AG). The surface roughness Ra is an arithmetic average roughness of in an area of 12.3 μm square of an AFM image of the reaction suppressing layer 28. The measurement was performed before depositing the oxide superconducting layer 30 on the reaction suppressing layer 28.

The results of the measurement are indicated in Table 1 above. In Table 1, wire rods having an Ra of less than 5 nm were represented by "A", and wire rods having an Ra of 5 nm or more were represented by "B".

The results indicated in Table 1 confirmed that when the film thickness of the reaction suppressing layer 28 is 140 nm or less, the surface roughness Ra of the reaction suppressing layer 28 was low.

(3) Electrical Conductivity

Electrical conductivity was evaluated by the measurement of critical current Ic of the obtained oxide superconducting wire rod (wire width: 10 mm). The critical current Ic was measured using a four-terminal technique with the oxide superconducting wire rod immersed in liquid nitrogen. The length of voltage terminal was 1 cm and the electric field criterion was 1 μV/cm.

The results of the measurement are indicated in Table 1 above. In Table 1, wire rods having a critical current Ic of 250 A or more are represented by "S", wire rods having a critical current Ic of from 180 A and less than 250 A are represented by "A", and wire rods having a critical current Ic of less than 180 A are represented by "B".

The results indicated in Table 1 confirmed that the critical currents Ic were improved in the superconducting wire rod according to each of Examples 1-1 to 1-7, Example 2, Examples 3-1 to 3-7, and Examples 4-1 to 4-7 including the reaction suppressing layer 28, compared to the superconducting wire rod according to Comparative Examples 1 to 3 not including the reaction suppressing layer 28. It is thought that this is because the generation of the impurity $BaCeO_3$ is suppressed. Furthermore, it was confirmed that, among Examples 1-1 to 1-7, Example 2, Examples 3-1 to 3-7, and Examples 4-1 to 4-7, the critical current Ic is improved in the superconducting wire rod of each of Examples 1-2 to 1-7, Example 2, Examples 3-2 to 3-7, and Examples 4-2 to 4-7 in which the impurity $BaCeO_3$ was not generated, compared to the critical current Ic in the superconducting wire rod of each of Examples 1-1 in which the impurity $BaCeO_3$ was generated.

In the Examples, the lattice constant of the reaction suppressing layer 28 made of $SrLaFeO_4$ is 0.388 nm, and that made of $CaLaFeO_4$ is 0.387 nm. The lattice constant of the oxide superconducting layer 30 is approximately from 0.38 nm to 0.39 nm. The cap layer 26 made of $CeO_2$ has a lattice constant of 0.541 nm, where the crystal lattice of the layer is in a position rotated by 45 degrees with respect to the upper and lower respective layers and an interlattice distance corresponding to the lattice constants of the upper and lower layers is approximately 0.38 nm (a half of a face diagonal distance of the lattice). Accordingly, it is thought that good crystal orientation was achieved in the oxide superconducting layer 30 because the reaction suppressing layer 28 formed between the cap layer 26 and the oxide superconducting layer 30 is lattice-matched with the cap layer 26, which is a layer thereunder, and has the lattice constant close to the lattice constant of the oxide superconducting layer 30, which is a layer thereon.

On the other hand, in the Comparative Examples, the lattice constant of $BaCeO_3$ generated between the oxide superconducting layer 30 and the cap layer 26 is approximately 0.44 nm. Therefore, it seems that, in the oxide superconducting layer 30, no crystal orientation occurred in oxide superconductor deposited on $BaCeO_3$, and thus Ic was decreased. Moreover, a superconducting current does not flow through an area formed of $BaCeO_3$ where the oxide superconducting layer 30 would have been formed, and thus Ic of the superconducting wire rod in the comparative examples was decreased.

Although $BaCeO_3$ was generated in Examples 1-1, 3-1, and 4-1, the amount thereof was small. Accordingly, influence on decrease in current paths in the oxide superconducting layer 30 was small, and Ic was not drastically decreased.

In addition to the above Examples, when a composition of YBCO was changed from $(Y_{0.7}Gd_{0.3})Ba_2Cu_3O_{7-\delta}$ to $YBa_2Cu_3O_{7-\delta}$, the results similar to those of the above Examples were obtained. When $REBa_2Cu_3O_{7-\delta}$ (RE represents other than Y and Pr) was used instead of $YBa_2Cu_3O_{7-\delta}$, the results similar to those of the above Examples were obtained.

In addition, when the configuration of the biaxially-oriented layer 24 was changed from a single layer of IBAD-GZO to a double layer of IBAD-GZO and IBAD-YNbO, the results similar to those of the above Examples were obtained.

Furthermore, when $PrO_2$ is used as the constituent material for the cap layer 26 instead of $CeO_2$, the results similar to those of the above Examples were obtained.

The results seem to be due to that the lattice constant of $PrO_2$ is 0.539 nm (the interlattice distance corresponding to the lattice constants of the upper and lower layers is approximately 0.38 nm), and thus, as in $CeO_2$, good crystal orientation was obtained in the oxide superconducting layer 30 as an upper layer. On the other hand, in wire rods having the same structures as in above Comparative Examples except for using $PrO_2$ instead of $CeO_2$, it was observed that $BaPrO_3$ was generated between the oxide superconducting layer 30 and the cap layer 26 and the Ic was decreased. The results are due to that, since the lattice constant of $BaPrO_3$ is approximately 0.43 nm, the current path was decreased in the oxide superconducting layer 30 as in Comparative Examples above, thus the Ic was decreased.

REFERENCE SIGNS LIST

10: Substrate
20: Intermediate layer
26: Cap layer
28: Reaction suppressing layer
30: Oxide superconducting layer

The invention claimed is:

1. A superconducting wire rod comprising:
    a substrate;
    an intermediate layer formed on the substrate;
    a reaction suppressing layer formed on the intermediate layer and mainly containing polycrystalline $SrLaFeO_{4+\delta1}$ or $CaLaFeO_{4+\delta2}$, in which the δ1 and the δ2 each represent an amount of non-stoichiometric oxygen; and
    an oxide superconducting layer formed on the reaction suppressing layer and mainly containing an oxide superconductor,
    wherein the oxide superconducting layer is formed by pulsed laser deposition (PLD), chemical vapor deposition (CVD), metal organic chemical vapor deposition (MOCVD) or sputtering,
    an outermost layer of the intermediate layer is a cap layer that mainly contains at least one selected from $CeO_2$ or $PrO_2$, and
    the reaction suppressing layer is sandwiched between and is directly in contact with the cap layer and the oxide superconducting layer.

2. The superconducting wire rod according to claim 1, wherein the intermediate layer comprises a rare earth element that reacts with Ba, and the oxide superconducting layer comprises Ba.

3. The superconducting wire rod according to claim 2, wherein the oxide superconductor is $REBa_2Cu_3O_{7-\delta2}$, in which the RE represents a single rare earth element or a plurality of rare earth elements, and the δ2 represents an amount of non-stoichiometric oxygen.

4. The superconducting wire rod according to claim 1, wherein the reaction suppressing layer has a thickness of from 20 nm to 140 nm.

5. The superconducting wire rod according to claim 1, wherein a thickness of the reaction suppressing layer is smaller than a thickness of the cap layer.

6. The superconducting wire rod according to claim 1, wherein crystal lattices of the $SrLaFeO_{4+\delta1}$ and $CaLaFeO_{4+\delta2}$ are cubic or orthorhombic.

7. A method for manufacturing a superconducting wire rod comprising:
    forming an intermediate layer on a metal substrate;
    forming, on the intermediate layer, a reaction suppressing layer mainly containing polycrystalline $SrLaFeO_{4+\delta1}$ or $CaLaFeO_{4+\delta2}$, in which each of the δ1 and the δ2 represents an amount of non-stoichiometric oxygen; and
    forming an oxide superconducting layer mainly containing an oxide superconductor on the reaction suppressing layer,
    wherein the forming the oxide superconducting layer comprises forming the oxide superconducting layer by pulsed laser deposition (PLD), chemical vapor deposition (CVD), metal organic chemical vapor deposition (MOCVD) or sputtering,
    an outermost layer of the intermediate layer is a cap layer that mainly contains at least one selected from $CeO_2$ or $PrO_2$, and
    the reaction suppressing layer is sandwiched between and is directly in contact with the cap layer and the oxide superconducting layer.

8. The method for manufacturing a superconducting wire rod according to claim 7, wherein the intermediate layer comprises a rare earth element that reacts with Ba, and the oxide superconducting layer comprises Ba.

9. The superconducting wire rod according to claim 1, wherein a layer between the outermost layer and another layer of the intermediate layer contains at least one polycrystalline material.

10. The superconducting wire rod according to claim 9, wherein the layer is formed by ion beam-assisted deposition.

11. The superconducting wire rod according to claim 9, wherein the layer is a composite layer that is additionally formed by an epitaxial process.

12. The superconducting wire rod according to claim 9, wherein the other layer is formed by an ion-beam sputtering process.

13. The superconducting wire rod according to claim 9, wherein the other layer is formed on the substrate.

14. The method for manufacturing the superconducting wire rod according to claim 7, further comprising forming the outermost layer by a radio frequency sputtering process.

15. The method for manufacturing the superconducting wire rod according to claim 7, further comprising forming a layer containing at least one polycrystalline material between the outermost layer and another layer of the intermediate layer.

16. The method for manufacturing the superconducting wire rod according to claim 15, wherein the forming the layer includes forming the layer by ion beam-assisted deposition.

17. The method for manufacturing the superconducting wire rod according to claim 15, further comprising forming the other layer by an ion-beam sputtering process.

18. A system, comprising:
means for forming an intermediate layer on a metal substrate;
means for forming, on the intermediate layer, a reaction suppressing layer mainly containing polycrystalline $SrLaFeO_{4+\delta 1}$ or $CaLaFeO_{4+\delta 2}$, in which each of the $\delta 1$ and the $\delta 2$ represents an amount of non-stoichiometric oxygen; and
means for forming an oxide superconducting layer mainly containing an oxide superconductor on the reaction suppressing layer,
wherein the means for forming the oxide superconducting layer forms the oxide superconducting layer by pulsed laser deposition (PLD), chemical vapor deposition (CVD), metal organic chemical vapor deposition (MOCVD) or sputtering,
an outermost layer of the intermediate layer is a cap layer that mainly contains at least one selected from $CeO_2$ or $PrO_2$, and
the reaction suppressing layer is sandwiched between and is directly in contact with the cap layer and the oxide superconducting layer.

19. The system according to claim 18, further comprising means for forming the outermost layer by a radio frequency sputtering process.

20. The system according to claim 18, further comprising means for forming a layer containing at least one polycrystalline material between the outermost layer and another layer of the intermediate layer.

* * * * *